United States Patent [19]
Jeon

[11] Patent Number: 6,141,265
[45] Date of Patent: Oct. 31, 2000

[54] CLOCK SYNCHRONOUS MEMORY

[75] Inventor: Chun Woo Jeon, Kyoungki-do, Rep. of Korea

[73] Assignee: Hyundai Electronics Industries Co., Ltd., Ichon-shi, Rep. of Korea

[21] Appl. No.: 09/353,799

[22] Filed: Jul. 15, 1999

[30] Foreign Application Priority Data

Jul. 15, 1998 [KR] Rep. of Korea ............... 98-28740

[51] Int. Cl.[7] ............... G11C 7/00; G11C 8/00
[52] U.S. Cl. ............... 365/194; 365/233
[58] Field of Search ............... 365/194, 233

[56] References Cited

U.S. PATENT DOCUMENTS

| | | | |
|---|---|---|---|
| 5,946,244 | 8/1999 | Manning | 365/194 |
| 5,946,268 | 8/1999 | Iwamoto et al. | 365/233 |
| 5,963,502 | 10/1999 | Watanabe et al. | 365/233 |
| 5,986,949 | 11/1999 | Toda | 365/194 |

*Primary Examiner*—Trong Phan
*Attorney, Agent, or Firm*—Jacobson, Price, Holman & Stern, PLLC

[57] ABSTRACT

A clock synchronous memory capable of accurately synchronizing a clock with data is provided. The clock synchronous memory has a fine delay control circuit for precisely synchronizing a clock with data. The fine delay control circuit uses a first type delay unit and a second type delay unit and allows the clock to pass through at least one of the first and second type delay units, thereby finely adjusting a delay time of the clock.

6 Claims, 5 Drawing Sheets

CLOCK SYNCHRONOUS MEMORY

BACKGROUND OF THE INVENTION

1. Field of the Invention

This invention relates to a semiconductor memory, and more particularly to a clock synchronous memory with a delay control circuit which controls the synchronism of a clock and input/output data.

2. Description of the Prior Art

Recently, the semiconductor memory has rapidly integrated. In addition to the high integration, the semiconductor memory requires a highly data access speed. An asynchronous system is used as a primary semiconductor memory. However, the asynchronous system limits the data access speed at the critical speed, and thus almost all of the recent semiconductor memories use a clock synchronous system.

The clock synchronous memory allows data to be accessed at super high speed. A synchronous DRAM (Direct Random Access Memory), a rambus DRAM and a synchronous link DRAM (hereinafter, SLDRAM) and so on, are commonly used as a clock synchronous memory. Particularly, the SLDRAM is known as a typical memory which performs data transmission in a packet system.

FIG. 1 is a block diagram showing the construction of a conventional SLDRAM system. The conventional SLDRAM system consists of a plurality of SLDRAMs 200-1 to 200-N and a memory controller 100 for controlling a data input/output operation of the plurality of SLDRAMs 200-1 to 200-N.

Next, the operation of the SLDRAM system shown in FIG. 1 will be described. In FIG. 1, the N SLDRAMs 200-1 to 200-N are commonly connected to the memory controller 100 by means of unidirectional command link which allows an unidirectional communication from the memory controller 100 toward each SLDRAM 200-1 to 200-N. Also, the SLDRAMs 200-1 to 200-N are commonly connected to the memory controller 100 through a bi-directional data link which performs a bi-directional communication between the memory controller 100 and each SLDRAM 200-1 to 200-N. Each SLDRAM 200-1 to 200-N receives the commands of a packet unit from the memory controller 100 through the command link and decodes the commands of the packet unit, thereby performing various operations such as a reading out, a writing and so on. The SLDRAMs receive or output data (read out data, data to be written, DCLK0 and DCLK1) through the data link. Actually, one command packet is applied to the SLDRAM 200 during a period of 4 ticks, and the data is output/applied from/to the SLDRAM 200 according to the command packet. Herein, the "tick" represents the half period of an operating frequency signal. For example, if the operating frequency signal is set up at a frequency of 300 MHz, the "tick" goes to 1.65 ns since one period of the operating frequency signal corresponds to 3.3 ns.

The SLDRAM 200 uses both the rising and falling edges of a clock. In other words, the data is output from the SLDRAM 200 each time the clock is toggled. Therefore, the quantity of the data responding to both the rising and falling edges of the clock is twice that of data responding to any one of the rising and falling edges of the clock. In the case of using a clock of 300 MHz, the data rate is 600 Mbit/s/p.

The following is a description for the operations wherein the data is transmitted between the memory controller 100 and the SLDRAM 200-1 to 200-N. When the data is read out from the SLDRAM 200-1 to 200-N, the SLDRAMs 200-1 to 200-N generate the clock DCLK and apply the clock DCLK with the read out data to the memory controller 100. Meanwhile, in the case of writing the data to the SLDRAMs 200-1 to 200-N, the memory controller 100 produces the clock DCLK and supplies the clock DCLK with the data to be written to the SLDRAMs 200-1 to 200-N.

However, in the case that SLDRAMs are arranged as shown in FIG. 1, each data transfer time is different from each other in the SLDRAMs 200-1 to 200-N when the data is transmitted between the memory controller 100 and each SLDRAM 200-1 to 200-N. A compensatory delay quantity is stored into a specific register in order for it to conform to the delay of the data, but the delay quantity stored into the specific register can differ from the delay quantity which is measured in reality. This results from an exterior factor, the load resistance of a signal line and so on. If the delay quantity differs, the transmission of the data may not be performed in an accurate timing. Also, a miss operation can be generated by the increase of the difference between the delay quantities.

SUMMARY OF THE INVENTION

Accordingly, it is an object of the present invention to provide a clock synchronous memory capable of accurately synchronizing a clock with a data.

A further objective of the present invention is to provide a clock synchronous memory adapted to facilely synchronize a clock with a data although the delay quantity differs from the memory devices in a system which includes a plurality of the memory devices such a SLDRAM.

In order to achieve these and other objectives of the invention, a clock synchronous memory according to an aspect of the present invention has a fine delay control circuit for precisely synchronizing a clock with data. The fine delay control circuit includes a first type delay unit and a second type delay unit and allows the clock to pass through at least one of the first and second type delay units, thereby finely adjusting a delay time of the clock.

The first type delay unit delays the clock by a first fine time unit, and the second type delay unit delays the clock by a second fine time unit shorter than the first fine time unit.

A fine delay control circuit according to another aspect of the present invention includes delay quantity setting means for setting a delay time of the clock to be delayed; a delay stage for responding to an output signal of the delay quantity setting means to selectively perform a first delay mode and a second delay mode; and decoding means for decoding the output signal of the delay quantity setting means and allowing the delay time of the clock delayed in the delay stage to vary with a first fine time unit.

BRIEF DESCRIPTION OF THE DRAWINGS

These and other objectives of the invention will become apparent from the following detailed description of the embodiments of the present invention with reference to the accompanying drawings in which.

DETAILED DESCRIPTION OF THE PREFERRED EMBODIMENT

Figure 1:
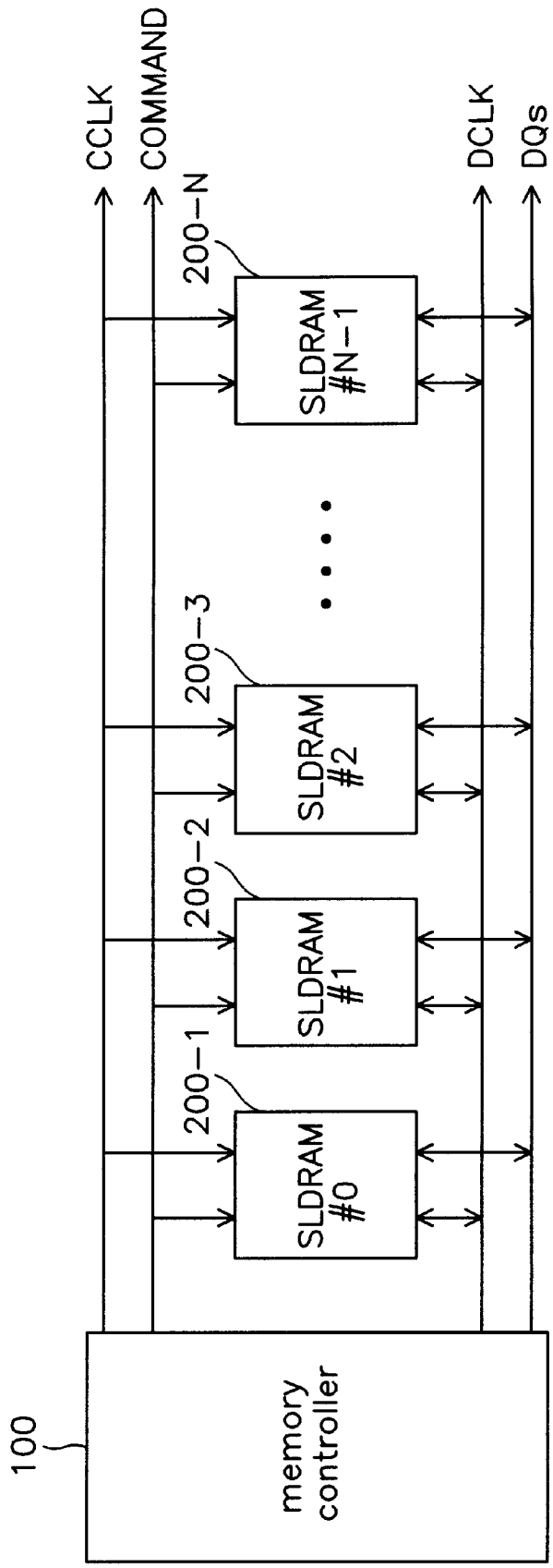
FIG. 1 is a schematic block diagram showing the configuration of a conventional SLDRAM system.
Figure 2:
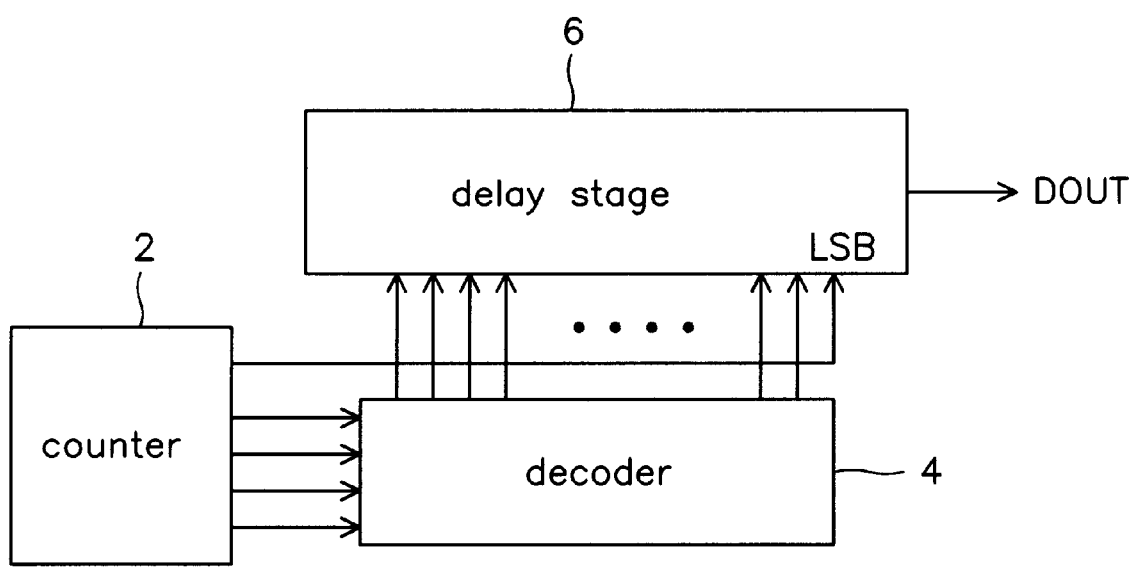
FIG. 2 is a schematic block diagram showing an embodiment of a fine delay control circuit according to the present invention.

Referring to FIG. 2, an embodiment of a fine delay control circuit according to the present invention is illustrated. In FIG. 2, the fine delay control circuit includes a delay stage 6 for delaying a clock, a counter 2 for establishing a delay quantity of the clock to be delayed by the delay stage 6, a decoder 4 for controlling the delay stage 6 to allow the delay quantity of the clock to be finely varied along with the counted output of the counter 2. The counter 2 resets a counted signal including 5 bit counted signals as the value of "0" (00000). Each time the clock is not synchronized with data signal, the counter 2 responds to pulses from a push switch or a controller (not shown) to count up the value of the counted signal by "1". The pulse is generated in the push switch when a user pushes down the push switch. On the other hand, the pulse is generated in the controller responding to a command from the user or a synchronous detecting signal. The counter 2 stops the counting operation when the clock is synchronized with the data signal. Also, the counter 2 applies the counted signal to the decoder 4 and the delay stage 6. Then, the decoder 4 receives the 4 bit counted signals without the least significant bit counted signal while the delay stage 6 inputs the least significant bit counted signal. The decoder 4 generates a select signal allowing the delay time (or delay quantity) of the delay stage 6 to increase gradually along with the value of 4 bit counted signals by a finely constant period of time (for example, 200 pico seconds). The select signal consists of 16 bit select signals SEL0 to SEL15, and these bit select signals SEL0 to SEL15 are exclusively enabled at a high level according to the value of the 4 bit counted signals. In other words, the 16 bit decoding signals SEL0 to SEL15 sequentially have a high value in accordance with increasing the value of the 4 bit counted signals. The delay stage 6 receives the least significant bit counted signal LSB from the counter 2 and the 16 bit select signals SEL0 to SEL15 from the decoder 4. The delay stage 6 performs any one of the first and the second delay modes on the basis of the value of the least significant bit counted signal LSB. The first delay mode allows the delay time of the delay stage 6 to increase from "0" by the constantly fine period of time (i.e., 200 pico seconds). The delay mode enables the delay time of the delay stage 6 to increase from a predetermined delay time (for example, 100 pico seconds) by the constantly fine period of time. The delay stage 6 enters the first delay mode when the least significant bit counted signal LSB has a low level, or enters the second delay mode if the least significant bit counted signal LSB goes to a high level. Also, the delay stage 6 increases the delay time of the clock CLK as a high level is proceeded from the least significant bit select signal SEL0 to the most significant bit select signal SEL15. In detail, the delay stage 6 increases the delay time of the clock CLK by the period of 200 pico seconds when the least significant bit select signal SEL0 has a high level. If the second lower significant bit select signal SEL1 goes to the high level, the delay stage 6 increases the delay time of the clock CLK by a period of 400 pico seconds. Finally, in the case that the most significant bit select signal SEL15 is a high level, the delay stage 6 increases the delay time of the clock CLK by a period of 3200 pico seconds.

In the operation of the fine delay control circuit shown in FIG. 2, the counter counts a value of "0" (00000) in the first. The decoder 4 decodes the counted value of "0" to provides a select signal corresponding to the value of "0". The delay stage 6 allows the clock to be delayed by the portion proceeding from a point corresponding to the value of "0" to an output terminal. If the clock delayed by means of the delay stage 6 is not synchronized with data, the counter 2 increases the counted value by "1". Then, the decoder 4 generates the select signal again corresponding to the counted value of "1", and the delay stage 6 delays the clock by means of the portion which proceeds from another point inputting the select signal to the output terminal. In case the delayed clock from the delay stage is not synchronized with the data again, the counter 2 increases the counted value until the delayed clock is synchronized with the data, thereby enabling the above described procedure to be repeated.

Figure 3:
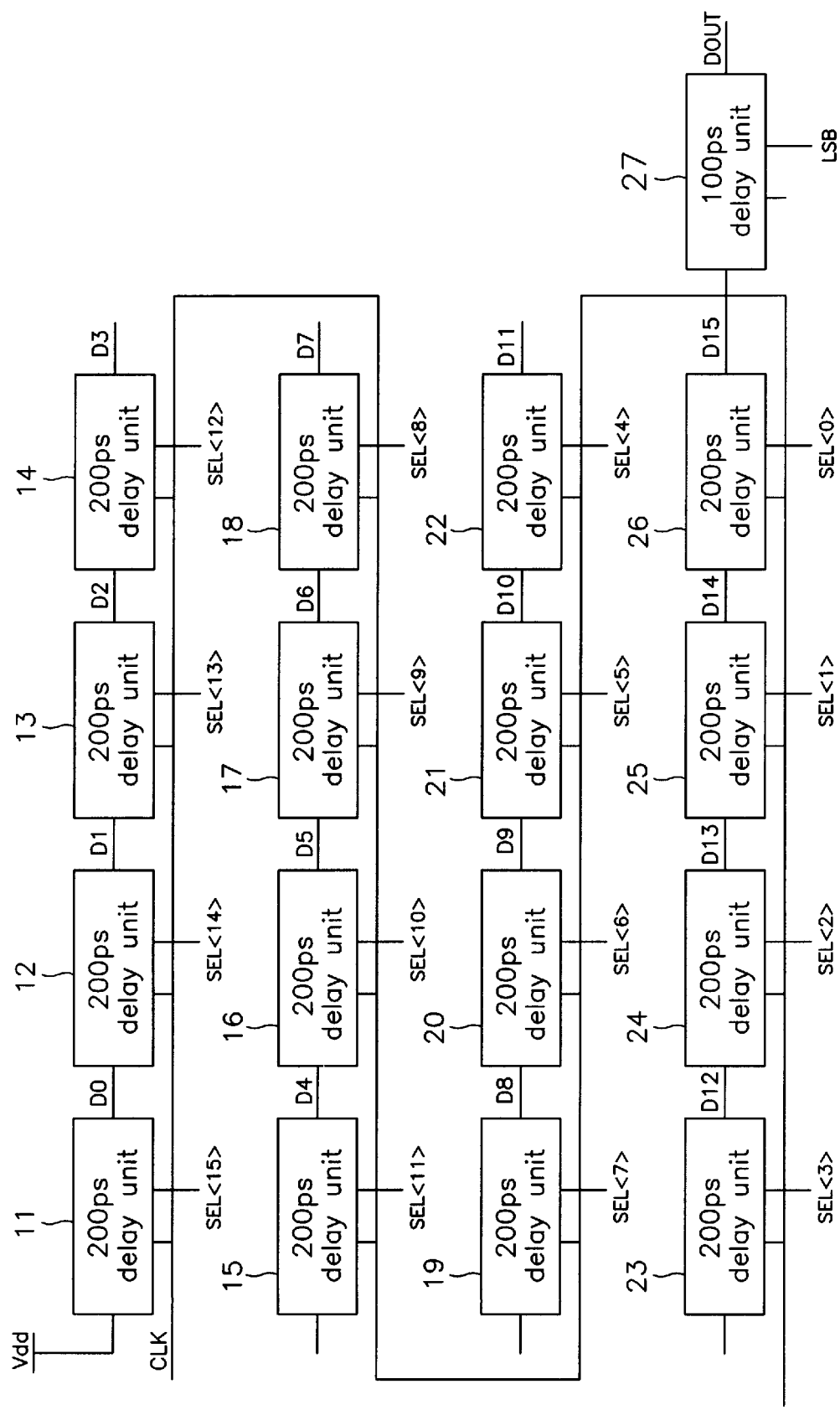
FIG. 3 is a schematic block diagram showing an embodiment of the delay stage in FIG. 2.

FIG. 3 shows in detail the delay stage 6 in FIG. 2. Referring to FIG. 3, the delay stage 6 includes 16 first type delay units connected between a power voltage source Vdd and a second type delay unit in serial. The first type delay units receive a clock CLK. The clock CLK is delayed by means of each of the first type delay units 11 to 26. Also, each of the first type delay units inputs the respective bit select signals SEL0 to SEL15 from the decoder 4 shown in FIG. 2. Each of the first type delay units 11 to 26 receives the clock CLK and delays the clock CLK by a period of 200 pico seconds, when the respective bit select signal SEL1 is enabled. The clock CLK delayed by the first type delay unit is applied to the next first type delay unit. On the other hand, if the respective bit select signal SELi is a low level, the respective first type delay unit delays the delayed clock Dj-1 from a previous first type delay unit by a period of 200 pico seconds. Meanwhile, the second type delay unit 27 receives the least significant bit counted signal LSB and selectively delays the clock CLK to the first type delay unit 26 by a period of 100 pico seconds according to the logic value of the least significant bit counted signal LSB. If the least significant bit counted signal LSB is a high level, the second type delay unit 27 delays the clock CLK from the first type delay unit 26 by a period of 100 pico seconds and outputs the delayed clock DOUT through an output terminal. The second type delay unit 27 originally outputs the clock CLK from the first type delay unit 26 to the output terminal without the delay.

In the delay stage 6 having a structure as described above, if the third bit select signal SEL2 has a high level and the least significant bit counted signal LSB goes to a low level, the clock CLK is delayed by means of the 3 first type delay units 24 to 26 during the period of 600 pico seconds. Then, each of the first type delay unit 24 to 26 delays the clock CLK by a period of 200 pico seconds. Also, when the fifth bit select signal SEL4 has a high level and the least significant bit counted signal LSB is a high level, the clock CLK is delayed by means of the 5 first type delay units 22 to 26 and the second type delay unit 27 during a period of 1100 pico seconds. In this case, each of the second type delay unit 22 to 26 delays the clock CLK by a period of 200 pico seconds, the second type delay unit 27 delays the clock CLK by a period of 100 pico seconds. Furthermore, in the case that the least significant bit counted signal LSB is only a high level, the clock CLK is delayed by means of the second type delay unit 27 during a period of 100 pico seconds. As described above, the delay stage 6 allows the first type delay units and the second type delay unit 27 to be driven selectively, thereby varying the delay quantity of the clock by a time unit of 100 pico seconds.

Figure 4:
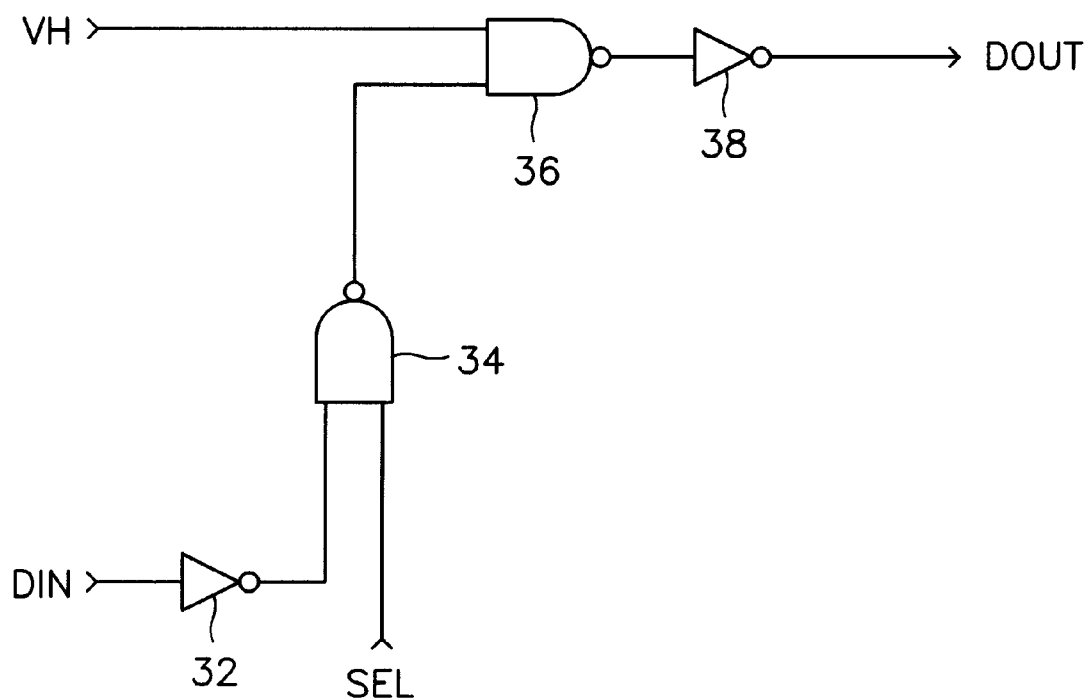
FIG. 4 is a schematic circuit diagram showing an embodiment of the first type delay unit shown in FIG. 3.

FIG. 4 illustrates an embodiment of the first type delay unit as shown in FIG. 3. In FIG. 4, the first type delay unit includes a first inverter 32, a first NAND gate element 34, second NAND gate element 36 and second inverter 38 connected serially between a clock line CLK and an output terminal Di. The first inverter 32 inverts the clock from the clock line CLK and applies the inverted clock to the first NAND gate element 34. The first NAND gate element 34 performs a NAND operation for a select signal from a select line SELi and an output signal of the first inverter 32. In detail, the first NAND gate element 34 inverts the output signal of the first inverter 32 when the select signal is a high level. On the other hand, if the select signal goes to a low level, the first NAND gate element 34 applies a high level signal to the second NAND gate element 36 and allows the output signal of the first inverter 32 to be cut off. The second NAND gate element 36 receives the output signal of the first NAND gate element 34 and an output signal of a previous delay unit from an input line Di-1. Also, the second NAND gate element 36 performs the NAND operation of the output signals of the first NAND gate element 34 and the previous delay unit. Consequently, the second NAND gate element 36 applies an inverted clock to the second inverter 38 when any one of the output signals of the first NAND gate element 34 and the previous delay unit includes the clock. The second inverter 38 inverts the output signal of the second NAND gate element 36 and provides a delayed clock on the output terminal Di. Then, the delayed clock developed on the output terminal Di has a phase delayed by the clock CLK by a propagation time of the second NAND gate element 36 and second inverter 38.

Figure 5:
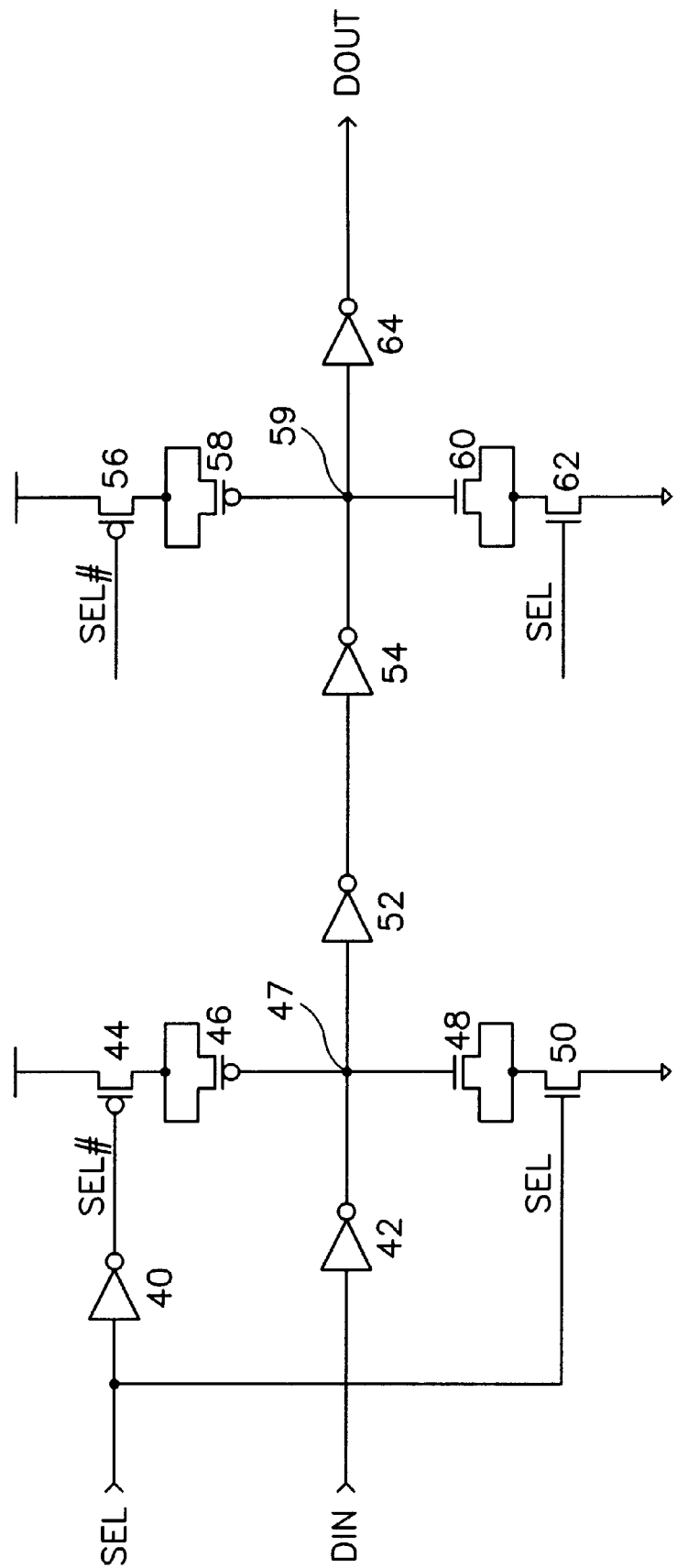
FIG. 5 is a circuit diagram depicting an embodiment of the second type delay unit shown in FIG. 3.

FIG. 5 depicts an embodiment of the second type delay unit 27 as shown in the FIG. 3. Referring to FIG. 5, the second type delay unit 27 includes an inverter 40 for inputting the least significant bit counted signal LSB from the counter 2 in FIG. 2, an inverter 42 for receiving an output signal of the first type delay unit 26, a PMOS transistor 44 having a gate terminal receiving the output signal of the inverter 44 and a source terminal connected to a power voltage source Vdd, a capacitor of a PMOS type connected between an output terminal 47 of the inverter 42 and the PMOS transistor 44, an NMOS transistor 50 having a gate terminal for receiving the least significant bit counted signal LSB and a source terminal connected to a ground voltage source GND, and a capacitor 48 of an NMOS type connected between the output terminal 47 of the inverter 42 and the NMOS transistor 50. Also, the second type delay unit 27 comprises three inverters 52, 54 and 64 connected serially between the inverter 42 and an output terminal DOUT, a PMOS transistor 56 having a gate terminal for receiving the output signal LSB# of the inverter 40 and a source terminal connected to the power voltage source Vdd, and a capacitor 58 of a PMOS type connected between an output terminal 59 of the inverter 54 and the PMOS transistor 56. In addition, the second type delay unit 27 includes an NMOS transistor 62 having a gate terminal for inputting the least significant bit counted signal LSB from the counter 2 and a source terminal connected to the ground voltage source GND and a capacitor 60 of an NMOS type connected between the output terminal 59 of the inverter 54 and the NMOS transistor 62. In the second type delay unit 27 having such a structure as described above, the NMOS transistors 44 and 56 are turned on when the least significant bit counted signal LSB has a high level. Then, the NMOS type capacitor 48 is connected between the node 47 and the ground voltage source GND to alternatively perform charging and discharging operations. Also, the NMOS type capacitor 60 is connected between the node 59 and the ground voltage source GND to alternatively perform charging and discharging operations. In addition, the PMOS transistors 44 and 56 are turned on as well as the NMOS transistors 50 and 62. The PMOS type capacitor 46 is connected between the node 47 and the power voltage source Vdd and the PMOS type capacitor 58 is also connected between the node 59 and the power voltage source Vdd. As a result, the clock CLK on the input terminal D15 is delayed by means of the NMOS type capacitors 48 and 60 and the PMOS type capacitors 46 and 58 during the period of 100 pico seconds. The delayed clock is developed at the output terminal DOUT. On the other hand, when the least significant bit counted signal LSB goes to a low level, the NMOS and PMOS transistors 44, 50, 56 and 62 are turned off. Then, the PMOS and NMOS type capacitors 44 and 48 are disconnected from the node 47 and the PMOS and NMOS type capacitors 58 and 62 are also disconnected from the node 59. Therefore, the clock on the input terminal D15 is originally applied to the output terminal DOUT without delay. Consequently, the first type delay unit 27 delays selectively the clock on the input terminal D15 by a period of 100 pico seconds on the basis of the logic value of the least significant bit counted signal LSB.

As described above, the clock synchronous memory according to the present invention allows the delay quantity of the clock to be controlled finely by the fine delay control circuit, thereby synchronizing accurately the clock and the data signal which are transmitted between the SLDRAMs and the memory controller. The fine delay control circuit employs the delay units of two different types to control the delay quantity of the clock by a fine time unit.

Although the present invention has been explained by the embodiments shown in the drawings described above, it should be understood to an ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A clock synchronous memory comprising:
   delay quantity setting means for setting a delay time of the clock to be delayed;
   decoding means for decoding the output signal of the delay quantity setting means and outputting a predetermined select signal corresponding to the decoding result; and
   a delay stage having at least two delay units of the first type connected in series, each of the delay units of the first type responding to an output signal of the decoding means to selectively delay the clock by a first fine time unit, and a second type delay unit connected to the last delay unit of the first type, the second type delay unit responding to a least significant bit signal of an output signal of the delay quantity setting means to selectively delay the clock by a second fine time unit.

2. The clock synchronous memory as claimed in claim 1, wherein the delay stage includes:
   at least two delay units of the first type connected in serial, each of the delay units of the first type responding to an output signal to selectively delay the clock by the first fine time unit; and
   a second type delay unit connected to the last delay unit of the first type, and the second type delay unit responding to the output signal of the delay quantity setting means to selectively delay the clock by a second fine time unit.

3. The clock synchronous memory as claimed in claim 1, wherein the second type delay unit responds to a least significant bit signal of the output signal from the delay quantity setting means.

4. The clock synchronous memory as claimed in claim 1, wherein the second type delay unit includes:
- a first inverter for inverting the least significant bit signal from the delay quantity setting means;
- a second inverter for inverting the output signal of the delay unit of the first type;
- a first PMOS transistor having a gate terminal for receiving an output signal of the first inverter and a source terminal connected to a power voltage source;
- a first capacitor connected between an output terminal of the second inverter and the first PMOS transistor;
- a first NMOS transistor having a gate terminal for receiving the least significant bit signal from the delay quantity setting means and a source terminal connected to a ground voltage source;
- a second capacitor connected between the output terminal of the second inverter and the first NMOS transistor;
- third to fifth inverters connected serially between the second inverter and an output line;
- a second PMOS transistor having a gate terminal for receiving the output signal of the first inverter and a source terminal connected to the power voltage source;
- a third capacitor connected between an output terminal of the third inverter and the second PMOS transistor;
- a second NMOS transistor having a gate terminal for inputting the least significant bit signal from the delay quantity setting means and a source terminal connected to the ground voltage source; and
- a fourth capacitor connected between the output terminal of the third inverter and the second NMOS transistor.

5. The clock synchronous memory as claimed in claim 1, wherein the first delay mode allows the delay time of the clock to increase from a first period and the second delay mode enables the delay time of the clock to increase from a second period.

6. The clock synchronous memory as claimed in claim 3, wherein the second type delay unit includes:
- a first inverter for inverting the least significant bit signal from the delay quantity setting means;
- a second inverter for inverting the output signal of the delay unit of the first type;
- a first PMOS transistor having a gate terminal for receiving an output signal of the first inverter and a source terminal connected to a power voltage source;
- a first capacitor connected between an output terminal of the second inverter and the first PMOS transistor;
- a first NMOS transistor having a gate terminal for receiving the least significant bit signal from the delay quantity setting means and a source terminal connected to a ground voltage source;
- a second capacitor connected between the output terminal of the second inverter and the first NMOS transistor;
- third to fifth inverters connected serially between the second inverter and an output line;
- a second PMOS transistor having a gate terminal for receiving the output signal of the first inverter and a source terminal connected to the power voltage source;
- a third capacitor connected between an output terminal of the third inverter and the second PMOS transistor;
- a second NMOS transistor having a gate terminal for inputting the least significant bit signal from the delay quantity setting means and a source terminal connected to the ground voltage source; and
- a fourth capacitor connected between the output terminal of the third inverter and the second NMOS transistor.

\* \* \* \* \*